(12) United States Patent
Liaw

(10) Patent No.: US 7,365,432 B2
(45) Date of Patent: Apr. 29, 2008

(54) MEMORY CELL STRUCTURE

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 388 days.

(21) Appl. No.: 11/121,621

(22) Filed: May 4, 2005

(65) Prior Publication Data

US 2006/0038234 A1 Feb. 23, 2006

Related U.S. Application Data

(60) Provisional application No. 60/603,695, filed on Aug. 23, 2004.

(51) Int. Cl.
*H01L 29/72* (2006.01)
(52) U.S. Cl. .................. 257/758; 257/206; 257/368
(58) Field of Classification Search ............... 257/206, 257/368, 758
See application file for complete search history.

(56) References Cited

U.S. PATENT DOCUMENTS

| 5,012,443 | A | 4/1991 | Ema |
|---|---|---|---|
| 6,417,530 | B1 | 7/2002 | Jung |
| 6,445,049 | B1 | 9/2002 | Iranmanesh |
| 6,643,167 | B2 * | 11/2003 | Nii .............................. 365/154 |
| 6,710,412 | B2 | 3/2004 | Tsukamoto et al. |
| 6,777,288 | B1 | 8/2004 | Clevenger et al. |
| 6,791,200 | B2 | 9/2004 | Nii |
| 6,828,689 | B2 | 12/2004 | Madurawe |
| 2002/0024049 | A1 | 2/2002 | Nii et al. |
| 2004/0007720 | A1 | 1/2004 | Clevenger et al. |
| 2005/0121610 | A1 | 6/2005 | Mall et al. |

OTHER PUBLICATIONS

Degalahal, V., et al., "Analyzing Soft Errors in Leakage Optimized SRAM Design, " Proc. of 16th International Conference on VLSI Design (Jan. 2003) pp. 227-233.
Osada, K., et al., "Cosmic-Ray Multi-Error Immunity for SRAM, Based on Analysis of the Parasitic Bipolar Effect," 2003 Symposium on VLSI Circuits Digest of Technical Papers (Jun. 2003, pp. 1-4.

* cited by examiner

*Primary Examiner*—Edward Wojciechowicz
(74) *Attorney, Agent, or Firm*—Slater & Matsil, L.L.P.

(57) ABSTRACT

An SRAM device includes an SRAM cell in a deep NWELL region in a substrate. PWELL regions in the SRAM cell occupy less than about 65% of the cell area of the SRAM cell. A ratio of a longer side of a cell area of the SRAM cell to a shorter side of the SRAM cell is larger than about 1.8. A total area of the active regions in the plurality of NMOS transistors in the SRAM cell occupies less than about 25% of the SRAM cell area. A ratio of the channel width of a pull up transistor in the SRAM cell to the channel width of a pull down transistor in the SRAM cell is greater than about 0.8. The SRAM cell further includes a boron free inter-layer-dielectric layer, an inter-metal-dielectric layer with dielectric constant less than about 3, and a polyimide layer with a thickness of less than about 20 microns.

20 Claims, 12 Drawing Sheets

MEMORY CELL STRUCTURE

This application claims the benefit of U.S. Provisional Application No. 60/603,695, filed on Aug. 23, 2004, entitled Memory Cell Structure, which application is hereby incorporated herein by reference.

TECHNICAL FIELD

The present invention relates generally to semiconductor devices and more particularly to a system for a memory cell structure.

BACKGROUND

Complementary metal-oxide-semiconductor (CMOS) technology is the dominant semiconductor technology used for the manufacture of ultra-large scale integrated (ULSI) circuits today. Size reduction of the semiconductor structures has provided significant improvement in the speed, performance, circuit density, and cost per unit function of semiconductor chips over the past few decades. Significant challenges, however, are faced as the sizes of CMOS devices continue to decrease.

One such challenge is soft errors. Soft errors are errors that occur in the logic state of a circuit due to excess charge carriers, which are typically induced by alpha-particles and cosmic ray neutrons. As the excess charge carriers are induced into a circuit, the logic values may be altered. For example, a logic value of a capacitor or line may be altered from a logic "0" to a logic "1," transistor gates may be turned off or on, or the like. Soft errors occurring in SRAM devices or other memory devices can cause the stored data to become corrupted.

Attempts have been made to limit the effect of excess charge carriers and soft errors on integrated circuits. One such attempt involves the addition of error-correcting circuitry (ECC). Another attempt involves increasing the cell size to increase the capacitance of charge nodes, thereby decreasing the effect of excess charge carriers. Yet another attempt requires additional capacitance, such as a MIM structure, trench capacitor, stack capacitor, or the like, to be added to the charge node. Yet another attempt involves increasing the resistance between the source/drain areas of the charge node and the gate of the charge node. Yet other attempts involve reducing the well resistance and/or increasing the well strapping frequency.

These attempts, however, generally require additional circuitry, additional processing, increased power requirements, and/or increased sizes, which may adversely affect the design and fabrication of smaller, more power-efficient integrated circuits. Therefore, a need exists for an integrated circuit that is more resilient to soft errors and excess charge carriers.

SUMMARY OF THE INVENTION

These and other problems are generally reduced, solved or circumvented, and technical advantages are generally achieved, by embodiments of the present invention, which provide a system for a memory cell structure.

In accordance with one aspect of the present invention, an SRAM device is provided, which includes a substrate. A deep NWELL region is in at least a portion of the substrate. An SRAM device is in the deep NWELL region. An SRAM array is in the SRAM device, and an SRAM cell is in the SRAM array. The SRAM array includes at least 8 columns of the SRAM cells. Each of the at least 8 columns includes at least 8 rows of the SRAM cells, and the SRAM cell includes an NWELL region and a PWELL region in the deep NWELL region. The NWELL region is interposed between two portions of the PWELL region. A cell area of the SRAM cell includes the NWELL region and the PWELL region. The PWELL region occupies less than about 65% of the cell area of the SRAM cell. A first cell pitch is aligned along a longer side of the cell area. A second cell pitch aligned along a shorter side of the cell area. A longitudinal axis of the PWELL region is substantially aligned with the shorter side of the cell area, and a cell aspect ratio of the first cell pitch to the second cell pitch is larger than about 1.8. The SRAM cell further includes a plurality of bit line wires. A longitudinal axis of the bit line is substantially aligned with the shorter side of the cell area. The SRAM cell further includes a plurality of n-type metal oxide semiconductor (NMOS) transistors in the PWELL region and a plurality of p-type metal oxide semiconductor (PMOS) transistor in the NWELL region. Each of the NMOS and PMOS transistors includes an active region. Each active region includes a channel region, and the channel region has a channel width. A gate structure includes a gate dielectric layer overlying the active region. A gate electrode layer, which includes a plurality of conductive layers, overlies the gate dielectric layer. A total area of the active regions in the plurality of NMOS transistors occupies less than about 25% of the cell area. The SRAM cell also includes a first inverter and a second inverter. Each of the inverters includes an input and an output. The output of the first inverter is electrically coupled to the input of the second inverter, and the output of the second inverter is electrically coupled to the input of the first inverter. Each inverter also includes a pull down transistor and a pull up transistor. The pull down transistor is one of the plurality of the NMOS transistors. The pull up transistor is one of the plurality of the PMOS transistors. The gate electrode of the pull down transistor is electrically connected to the gate electrode of the pull up transistor to form the input of the inverter. A drain region in the active region of the pull down transistor is electrically connected to a drain region of the pull up transistor to form the output. A ratio of the channel width of the pull up transistor to the channel width of the pull down transistor is in a range between about 0.8 and about 1.5. The SRAM cell still further includes a first storage node electrically connected to the output of the first inverter and a second storage node electrically connected to the output of the second inverter. The SRAM cell includes a boron free inter-layer-dielectric (ILD) layer. The boron free ILD includes a plurality of boron free dielectric layers and overlies the first and the second inverters. The SRAM cell includes an inter-metal-dielectric (IMD) layer, which includes a plurality of dielectric layers surrounding a plurality of metal wires and overlies the ILD layer. The plurality of dielectric layers have a dielectric constant less than about 3. The SRAM cell includes a polyimide layer overlying the SRAM device. The polyimide layer has a thickness that is less than about 20 microns.

In accordance with another aspect of the present invention, a semiconductor device is provided, which includes a substrate. An SRAM device is in the substrate, and an SRAM cell in the SRAM device. The SRAM cell includes a cell area, a first cell pitch aligned along a longer side of the cell area, and a second cell pitch aligned along a shorter side of the cell area. A cell pitch ratio of the first cell pitch to the second cell pitch is larger than about 2. The SRAM cell also includes a plurality of inter-metal-dielectric (IMD) layers overlying the substrate. The plurality of IMD layers has a dielectric constant that is less than about 3. The IMD layers include metal wires therein.

In accordance with yet another aspect of the present invention, a semiconductor device is provided, which includes a substrate. An SRAM device is in the substrate, and an SRAM cell is in the SRAM device. The SRAM cell includes a cell area. The cell area includes an NWELL region and a PWELL region. The NWELL region is interposed between two portions of the PWELL region. The PWELL region occupies less than about 65% of the cell area. A plurality of n-type metal oxide semiconductor (NMOS) transistors is in the PWELL regions. A plurality of p-type metal oxide semiconductor (PMOS) transistors is in the NWELL region. A total area of the active regions of the NMOS transistors is less than about 25% of the cell area. A plurality of inter-metal-dielectric (IMD) layers overly the substrate. The plurality of IMD layers has a dielectric constant less than about 3. The IMD layers include metal wires therein.

In accordance with still another aspect of the present invention, a semiconductor device is provided, which includes a substrate. The semiconductor also includes a deep NWELL region in the substrate and an SRAM device in the deep NWELL region. An SRAM cell is in the SRAM device. The SRAM cell includes an NWELL region and a PWELL region in the deep NWELL region. The NWELL region is interposed between two portions of the PWELL region. A cell area includes the NWELL region and the PWELL region. The PWELL region occupies a total area of less than about 65% of the cell area. The cell area includes a first cell pitch aligned along a longer side of the cell area, and a second cell pitch aligned along a shorter side of the cell area. A cell pitch ratio of the first cell pitch to the second cell pitch is larger than about 2. A plurality of n-type metal oxide semiconductor (NMOS) transistors is in the PWELL regions and a plurality of p-type metal oxide semiconductor (PMOS) transistor in the NWELL region. The transistors include an active region. The active region includes a channel region. The channel region includes a channel width. A total area of the active regions of the NMOS transistors occupies less than about 25% of the cell area. A plurality of inter-metal-dielectric (IMD) layers overly the substrate. The plurality of IMD layers have a dielectric constant less than about 3 and include metal wires therein. A polyimide layer overlies the IMD layers. The polyimide layer has a thickness that is less than about 20 microns.

In accordance with yet another aspect of the present invention, a semiconductor device is provided, which includes a substrate. An SRAM device is in the substrate, and an SRAM cell is in the SRAM device. The SRAM cell includes an NWELL region and a PWELL region in the substrate. The NWELL region is interposed between two portions of the PWELL region. A cell area includes the NWELL region and the PWELL region. A plurality of n-type metal oxide semiconductor (NMOS) transistors is in the PWELL region and a plurality of p-type metal oxide semiconductor (PMOS) transistors in the NWELL region. The transistors include a channel region have a channel width. The SRAM cell also includes a first and a second inverter. An output of the first inverter is electrically coupled to an input of the second inverter. An output of the second inverter is electrically coupled to an input of the first inverter. Each of the inverters includes an input and an output. Each inverter also includes a pull down transistor and a pull up transistor. The pull down transistor is one of the plurality of NMOS transistors, and the pull up transistor is one of the plurality of the PMOS transistors. A ratio of the channel width of the pull up transistor to the channel width of the pull down transistor is greater than about 0.8. The SRAM cell also includes an inter-metal-dielectric (IMD) layer. The IMD layer includes a plurality of dielectric layers and overlies the substrate. The plurality of dielectric layers have a dielectric constant less than about 3 and include metal wires therein.

In accordance with another aspect of the present invention, a semiconductor device is provided, which includes a substrate. An SRAM device is in the substrate, and an SRAM cell is in the SRAM device. The SRAM cell includes an NWELL region and a PWELL region. The NWELL region is interposed between two portions of the PWELL region. The SRAM cell further includes a cell area with a first cell pitch aligned along a longer axis of the cell area, and a second cell pitch aligned along a shorter axis of the cell area. A cell pitch ratio of the first cell pitch to the second cell pitch is larger than about 2. A plurality of n-type metal oxide semiconductor (NMOS) transistors is in the PWELL regions, and a plurality of p-type metal oxide semiconductor (PMOS) transistor is in the NWELL region. The transistors include a channel region. The channel region has a channel width. The SRAM cell also includes a first and a second inverter. Each of the inverters has an input and an output. An output of the first inverter is electrically coupled to an input of the second inverter. An output of the second inverter is electrically coupled to an input of the first inverter. Each of the inverters also includes a pull down and a pull up transistor. The pull down transistor is one of the plurality of NMOS transistors, and the pull up transistor is one of the plurality of the PMOS transistors. A ratio of the channel width of the pull up transistor to the channel width of the pull down transistor is greater than about 0.8.

In accordance with yet another aspect of the present invention, a semiconductor device is provided, which includes a substrate. An SRAM device is in the substrate, and an SRAM cell is in the SRAM device. The SRAM cell includes an NWELL region and a PWELL region. The NWELL region is interposed between two portions of the PWELL region. A cell area includes a first cell pitch aligned along a longer axis of the cell area, and a second cell pitch aligned along a shorter axis of the cell area. A cell pitch ratio of the first cell pitch to the second cell pitch is greater than about 2.5. A plurality of inter-metal-dielectric (IMD) layers overlies the substrate. The plurality of IMD layers have a dielectric constant less than about 3 and include metal wires therein.

In accordance with still another aspect of the present invention, a semiconductor device is provided, which includes a substrate. A deep NWELL region is in substrate, and an SRAM device is in the deep NWELL region. An SRAM cell is in the SRAM device. The SRAM cell includes an NWELL region and a PWELL region. The NWELL region is interposed between two portions of the PWELL region. The SRAM cell has a cell area. The cell area includes the NWELL region and the PWELL region. The PWELL region occupies less than about 65% of the cell area. A plurality of n-type metal oxide semiconductor (NMOS) transistors is in the PWELL regions and a plurality of p-type metal oxide semiconductor (PMOS) transistor in the NWELL region. The transistors include an active region, and the active region has a channel region. The channel region has a channel width. The SRAM cell also includes a gate structure, and the gate structure has a gate dielectric layer overlying the active region. The gate structure also has a gate electrode layer. The gate electrode layer has a plurality of conductive gate layers overlying the gate dielectric layer.

The active regions of the NMOS transistors occupy less than about 25% of the cell area. A first cell pitch of the cell area is aligned along a longer axis of the cell area, and a second cell pitch is aligned along a shorter axis of the cell area. A cell pitch ratio of the first cell pitch to the second cell pitch is larger than about 1.8. A plurality of inter-metal-dielectric (IMD) layers overlies the substrate. The plurality of IMD layers have a dielectric constant less than about 3 and include metal wires therein.

In accordance with a further aspect of the present invention, a semiconductor device is provided, which includes a substrate. An SRAM device is in the substrate; and a memory cell is in the SRAM device. The memory cell includes an NWELL region and a PWELL region. The NWELL region is interposed between two portions of the PWELL region. The SRAM device includes a cell area. The cell area includes a first cell pitch aligned along a longer axis of the cell area. The SRAM device also includes a second cell pitch aligned along a shorter axis of the cell area. A cell pitch ratio of the first cell pitch to the second cell pitch is larger than about 2. The memory cell includes a plurality of n-type metal oxide semiconductor (NMOS) transistors in the PWELL regions and a plurality of p-type metal oxide semiconductor (PMOS) transistor in the NWELL region. The transistors include an active region. The active region includes a channel region. The channel region includes a channel width. The transistors further include a gate structure. The gate structure includes a gate dielectric layer overlying the active region. The transistors also include a gate electrode layer having a plurality of conductive gate layers and overlying the gate dielectric layer. The memory cell also includes a first and a second inverter. Each of the inverters includes an input and an output. An output of the first inverter is electrically coupled to an input of the second inverter. An output of the second inverter is electrically coupled to an input of the first inverter. Each inverter includes a pull down transistor and a pull up transistor. The pull down transistor is one of the plurality of NMOS transistors, and the pull up transistor is one of the plurality of the PMOS transistors. A ratio of the channel width of the pull up transistor to the channel width of the pull down transistor is greater than about 0.8.

In accordance with still another aspect of the present invention, a semiconductor device is provided, which includes a substrate. An SRAM device is in the substrate, and a memory cell is in the SRAM device. The memory cell includes an NWELL region and a PWELL region. The memory cell also includes a cell area. The cell area includes a first cell pitch aligned along a latitudinal axis of the cell area and a second cell pitch aligned along a longitudinal axis of the cell area. A cell pitch ratio of the first cell pitch to the second cell pitch is greater than about 2.5. A plurality of inter-metal-dielectric (IMD) layers overlies the substrate. The plurality of IMD layers has a dielectric constant that is less than about 3. The IMD layers include metal wires therein.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The making and using of the presently preferred embodiments are discussed in detail below. It should be appreciated, however, that the present invention provides many applicable inventive concepts that can be embodied in a wide variety of specific contexts. In particular, the method of the present invention is described in the context of forming a six-transistor static random access memory (6T-SRAM) and an eight-transistor (8T)-SRAM. One of ordinary skill in the art, however, will appreciate that features of the present invention described herein may be used for forming other types of devices, such as other SRAM configurations and memory devices other than SRAMs. Accordingly, the specific embodiments discussed herein are merely illustrative of specific ways to make and use the invention, and do not limit the scope of the invention.

Figure 1:
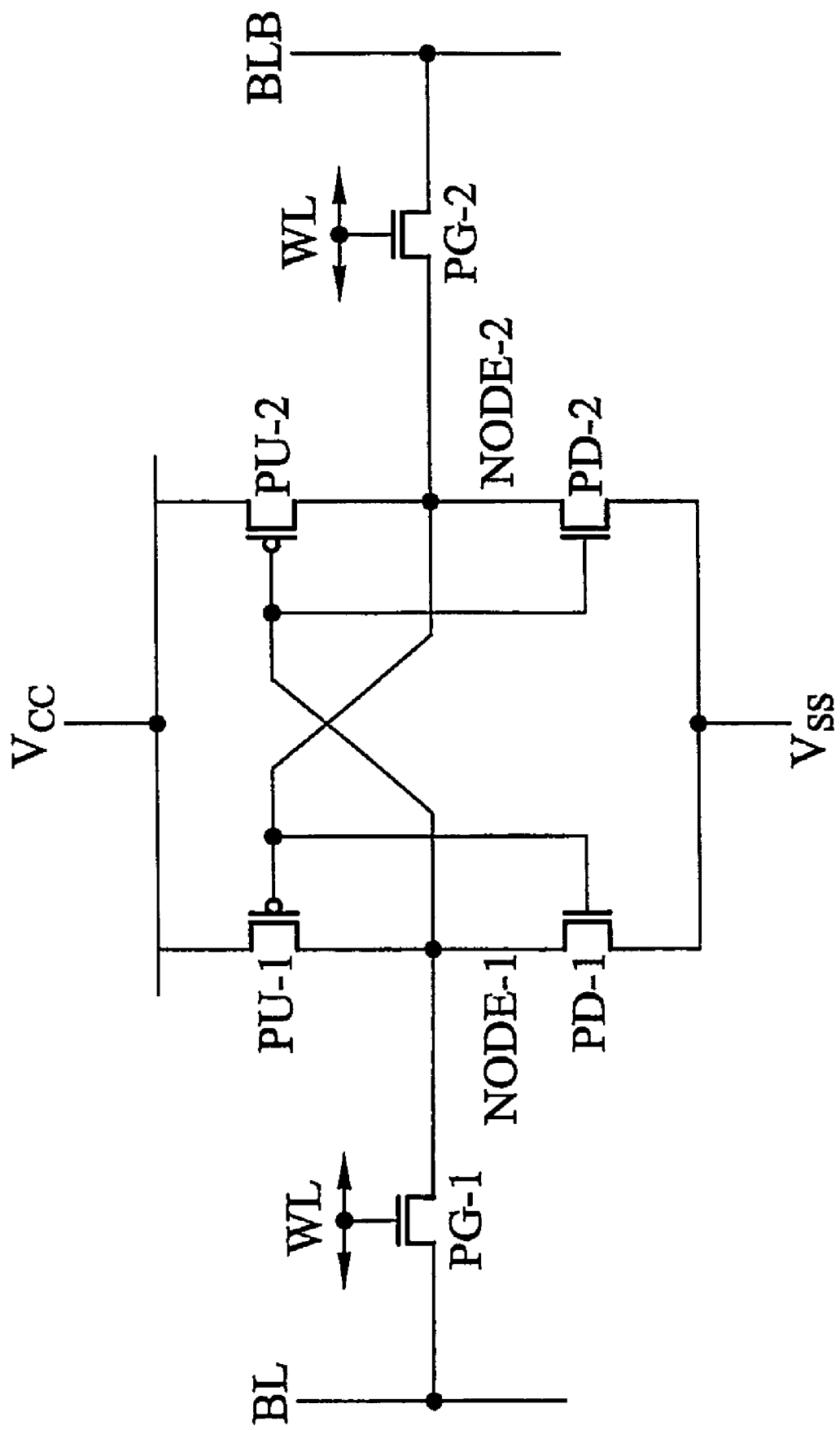
FIG. 1 is a schematic diagram of a 6T-SRAM cell in accordance with a first illustrative embodiment of the present invention.
Figure 2:
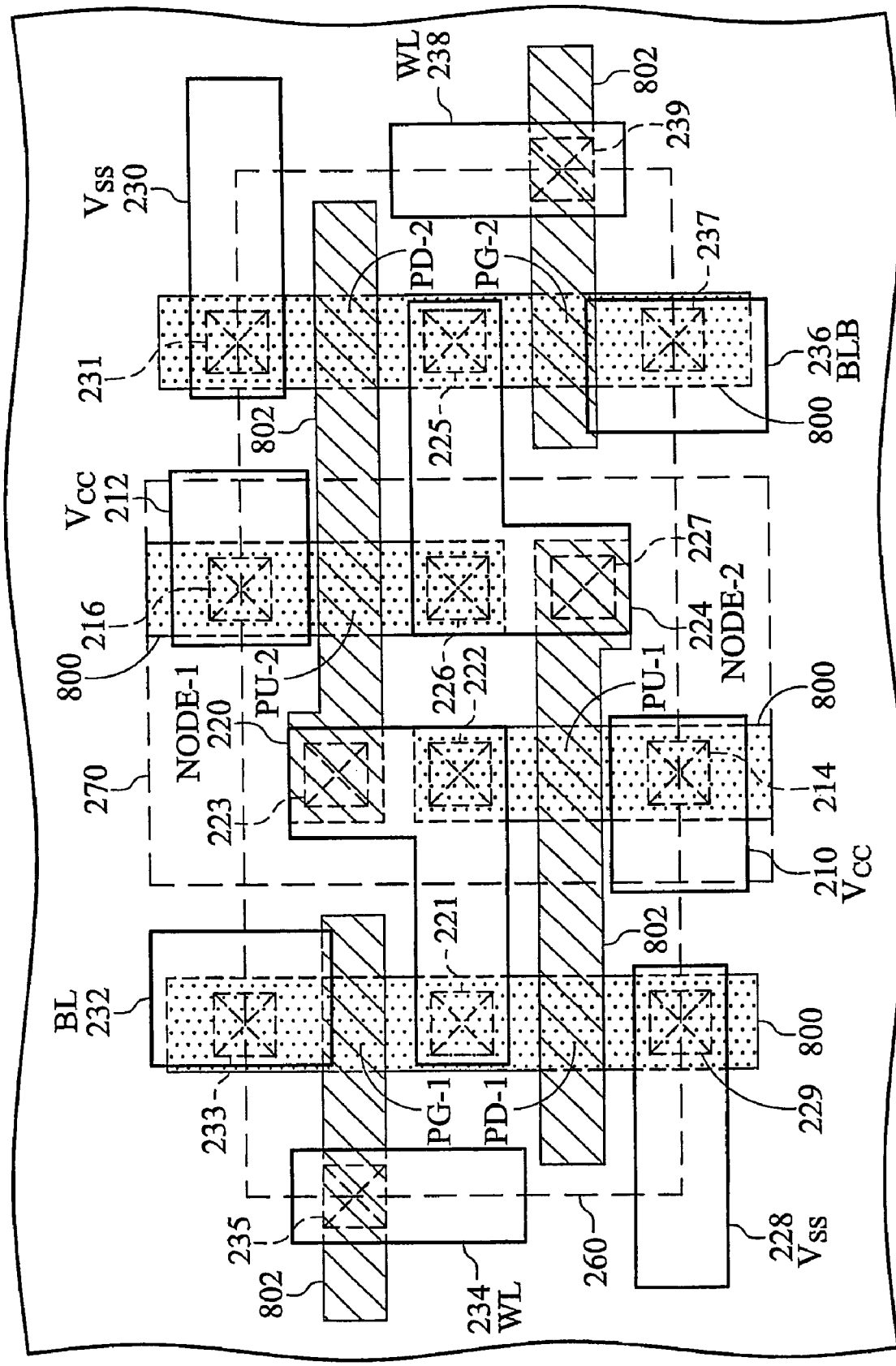
FIG. 2 is a plan view of transistor formation and the M1 layer of the 6T-SRAM in accordance with the first illustrative embodiment.
Figure 3:
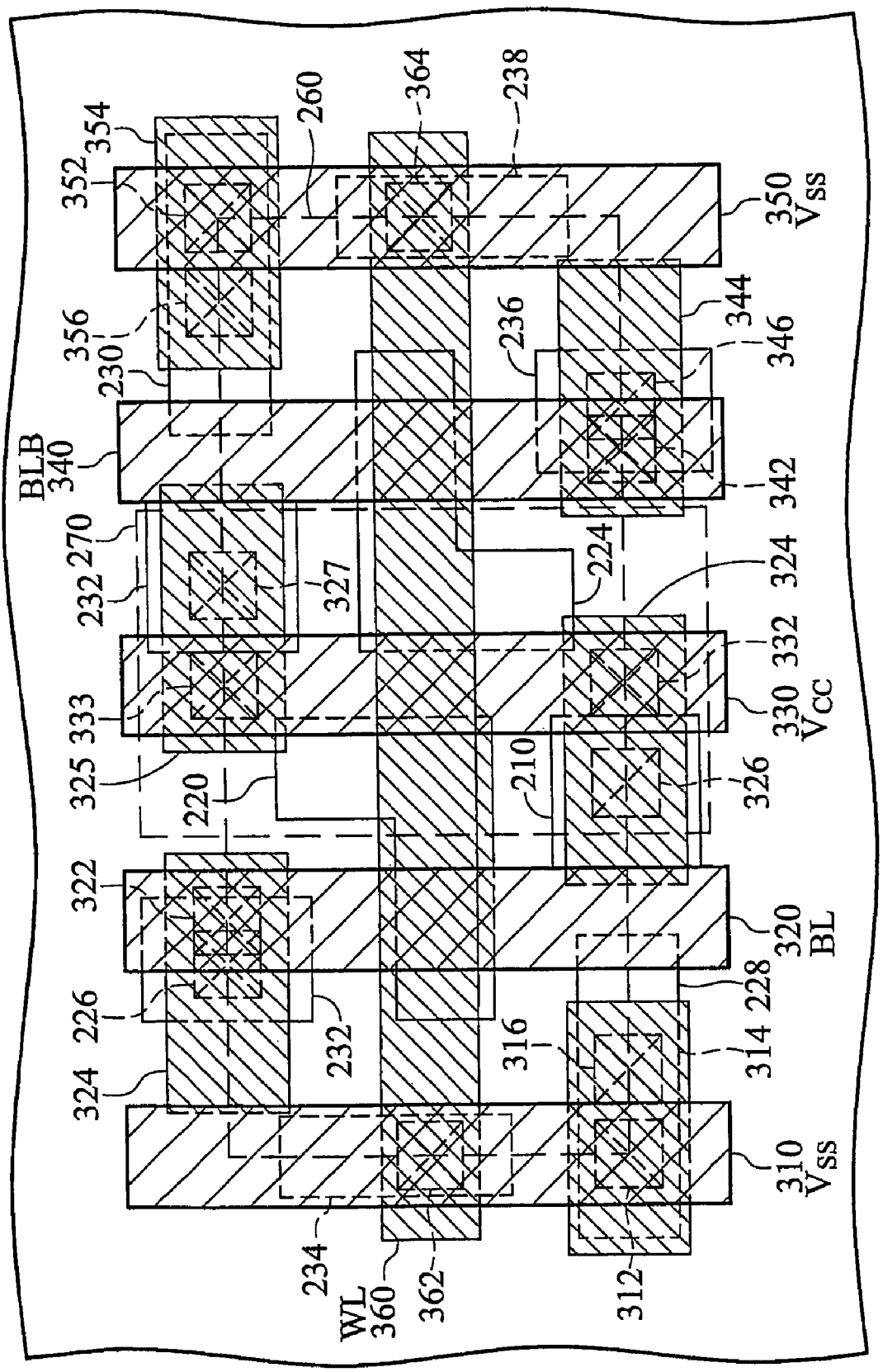
FIG. 3 is a plan view of the M1, M2, and M3 layers in accordance with the first illustrative embodiment.

An embodiment of the present invention preferably provides a high speed SRAM device with a low SER. Six embodiments are discussed below which illustrate various views and configurations of a high speed, low soft error rate (SER) SRAM. FIGS. 1-3 show various views of a high speed, low SER 6T-SRAM cell in accordance with a first illustrative embodiment of the present invention.

Referring first to FIG. 1, a schematic diagram of the 6T-SRAM cell of the first embodiment is shown. Generally, the 6T-SRAM cell comprises a first pass-gate transistor PG-1, a second pass-gate transistor PG-2, a first pull-up transistor PU-1, a second pull-up transistor PU-2, a first pull-down transistor PD-1, and a second pull-down transistor PD-2.

In operation, the memory cell of the first embodiment forms two complementary nodes, shown as NODE-1 and NODE-2 in FIG. 1. Because NODE-1 is tied to the gate of the second pull-up transistor PU-2 and NODE-2 is tied to the gate of the first pull-up transistor PU-1, the values stored in each node will remain complementary to each other. For example, when NODE-1 is high, the PMOS second pull-up transistor PU-2 prevents the current from the current source $V_{cc}$ from flowing to NODE-2. In parallel, the gate of the NMOS second pull-down transistor PD-2 is activated, allowing any charge that may be in NODE-2 to go to ground. Furthermore, when NODE-2 is low, the PMOS first pull-up transistor PU-1 allows current to flow from $V_{cc}$ to NODE-1, and the gate of the NMOS first pull-down transistor PD-1 is de-activated, preventing the charge in NODE-1 from going to ground. The gates of the first pass-gate transistor PG-1 and the second pass-gate transistor PG-2 are electrically coupled to a word line WL to control reading data from, and writing data to, the memory cell. Values stored in NODE-1 and NODE-2 are read on a bit-line BL and a complementary bit line BLB, respectively, which are electrically coupled to a sense amplifier (not shown).

FIGS. 2 and 3 are plan views of a layout of a 6T-SRAM cell in accordance with one embodiment of the present invention. Specifically, FIG. 2 shows selected semiconductor layers of the first embodiment and the first metal layer (M1). The discussion will then transition to the metal layers overlying the semiconductor layers of the first embodiment. The metal layers overlying the semiconductor layers are shown in FIG. 3.

Referring now to the 6T-SRAM cell of the first embodiment shown in FIG. 2, one skilled in the art will recognize transistors formed from the gate electrodes 800 overlying the channel regions of the active areas 802. The source and drain regions of the transistors are also in the active areas, on oppositely adjacent sides of the channel regions. The transistors in FIG. 2 may be referred to as a first pass-gate transistor PG-1, a second pass-gate transistor PG-2, a first pull-up transistor PU-1, a second pull-up transistor PU-2, a first pull-down transistor PD-1, and a second pull-down transistor PD-2 formed on a substrate. The substrate may be, for example, formed of bulk Si, SiGe, strained-Si, SOI, non-bulk Si, or the like. The gate electrodes of the first embodiment comprise a plurality of conductive materials. The gate electrode layer has a thickness that is less than about 2000 Å. The gate electrode layer has a thickness that is preferably less than about 1000 Å. A gate dielectric layer is interposed between the gate electrodes and the active areas. The gate dielectric layer has a thickness that is less than about 50 Å. The gate dielectric layer has a thickness that is preferably less than about 20 Å. The gate dielectric layer may be a single layer or may have multiple layers comprising a plurality of dielectric materials. At least one layer preferably comprises $SiO_2$, nitrided oxide, a nitrogen-containing oxide, SiON, a metal oxide, a high-K dielectric, or combinations thereof.

As shown in FIG. 2, the first and second pull-up transistors, PU-1 and PU-2 respectively, are PMOS transistors formed in an n-well 270. The PMOS transistors PU-1 and PU-2 may alternatively be formed in other types of n-wells, such as a deep n-well.

One skilled in the art will recognize the electrical connectivity shown in FIG. 2. The first embodiment in FIG. 2 shows the sources of the first pull-up transistor PU-1 and the second pull-up transistor PU-2 being electrically coupled to a voltage source $V_{cc}$ via contact lines 210 and 212, respectively, located on M1, via plugs 214 and 216. The drain of the first pull-up transistor PU-1, the drain of the first pull-down transistor PD-1, the drain of the first pass-gate transistor PG-1, and the gates of the second pull-up transistor PU-2 and the second pull-down transistor PD-2 are electrically coupled via an intra-cell connection 220 located on M1 and plugs 221, 222, and 223. Similarly, the drain of the second pull-up transistor PU-2, the drain of the pull-down transistor PD-2, the drain of the second pass-gate transistor PG-2, and the gates of the first pull-up transistor PU-1 and the first pull-down transistor PD-1 are electrically coupled via an intra-cell connection 224 located on M1 and plugs 225, 226, and 227.

With continuing reference to the electrical connectivity of the first embodiment shown in FIG. 2, the source of the first pull-down transistor PD-1 is electrically coupled to ground $V_{ss}$ via a $V_{ss}$ contact line 228 and a plug 229. The source of the second pull-down transistor PD-2 is electrically coupled to ground $V_{ss}$ via a $V_{ss}$ contact line 230 and a plug 231. The source of the first pass-gate transistor PG-1 is electrically coupled to the bit line wire BL via a bit line wire contact line 232 and plug 233. The first pass-gate transistor PG-1 electrically couples the bit line wire BL to the drain of the first pull-up transistor PU-1 and the drain of the first pull-down transistor PD-1. The gate of the first pass-gate transistor PG-1 is electrically coupled to the word line wire via a WL contact line 234 on M1 and plug 235.

With further reference to the electrical connectivity of the first embodiment shown in FIG. 2, the source of the second pass-gate transistor PG-2 is electrically coupled to the complementary bit line BLB via a complementary bit line BLB contact line 236 and plug 237. Similarly, the second pass-gate transistor PG-2 electrically couples the bit line wire BLB to the drain of the second pull-up transistor PU-2 and the drain of the second pull-down transistor PD-2. The gate of the second pass-gate transistor PG-2 is electrically coupled to the word line wire via a WL contact line 238 on M1 and plug 239.

A dotted line in FIG. 2 represents the boundary of the surface area of the memory cell 260. The memory cell 260 may also be referred to as a unit cell 260. It should be noted that the boundary may not be readily apparent in a finished product. The unit cell 260 defines the basic building block for designing memory arrays. Memory devices typically have one or more memory arrays. The unit cell 260 may be duplicated any number of times (e.g., thousands, millions, billions, or trillions) to create memories capable of storing various amounts of data.

As shown in FIG. 2, the boundary of the unit cell 260 of the first embodiment has a rectangular shape. The boundary has two longer sides of proportionately equal length and two shorter sides of proportionately equal length. Preferably, the length of a longer side of the unit cell 260 is about 1.8 times greater than the length of a shorter side of the unit cell 260. The length of the longer side of the unit cell 260 may also be about 2 times or greater than the length of the shorter side of the unit cell 260. The ratio of the length of the longer side to the shorter side may also be referred to as a cell pitch ratio or a cell aspect ratio. It is noted that the gate electrodes in the first embodiment are aligned with the axes of the longer sides of the boundary. It is also noted that the active regions in the first embodiment are aligned with an axis of the shorter sides of the unit cell 260.

An n-well 270 is formed within the unit cell 260 of the first embodiment, as shown in FIG. 2. The n-well 270 may alternatively be a deep n-well, for example. Preferably, the substrate is a p-type substrate, thereby providing a large p-well substantially encircling the n-well 270, on which NMOS devices may be formed. The n-well 270 is formed on the substrate by performing an implant with n-type ions as is known in the art, thereby allowing PMOS devices to be formed therein, such as the first pull-up transistor PU-1 and the second pull-up transistor PU-2.

As shown in FIG. 2, the NMOS active area of the first embodiment includes the source/drain areas of the first pass-gate transistor PG-1, the first pull-down transistor PD-1, the second pass-gate transistor PG-2, and the second pull-down transistor PD-2. In the first embodiment, the NMOS active area comprises less than about 25% of the area of the unit cell 260, and the p-well area comprises less than about 65% of the area of the unit cell 260.

FIG. 3 is a plan view of the metal layers M1, M2, and M3 of the first embodiment. The metal layers of the first embodiment are overlying the layers shown in FIG. 2. The M3 layer includes a first $V_{ss}$ line 310, a bit line wire BL 320, a $V_{cc}$ line 330, a complementary bit line BLB 340, and a second $V_{ss}$ line 350. In this embodiment, the longitudinal axes of the lines contained on M3 are preferably parallel to the shorter side of the unit cell 260. Regarding the first $V_{ss}$ line 310, a via 312 electrically couples the $V_{ss}$ line 310 on M3 to contact line 314 on M2, which is electrically coupled to contact line 228 on M1 (as shown in FIG. 2) through via 316. The contact line 228 on M1 is electrically coupled to the source of the first pull-down transistor PD-1 as discussed above with reference to FIG. 2.

Regarding the bit line wire BL 320, a via 322 electrically couples the bit line wire BL 320 on M3 to contact line 324 on M2, which is electrically coupled to contact line 232 on M1 (as shown in FIG. 2) through via 326. The contact line 232 on M1 is electrically coupled to the source of the first pass-gate transistor PG-1 as discussed above with reference to FIG. 2.

Regarding the $V_{cc}$ line 330, a via 332 electrically couples the $V_{cc}$ line 330 on M3 to contact line 324 on M2, which is electrically coupled to contact line 210 on M1 (as shown in FIG. 2) through via 326. The contact line 210 on M1 is electrically coupled to the source of the first pull-up transistor PU-1, as shown in FIG. 2. Additionally, a via 333 electrically couples the $V_{cc}$ contact line 330 on M3 to contact line 325 on M2, which is electrically coupled to contact line 212 on M1 through via 327. The contact line 212 on M1 is electrically coupled to the source of the second pull-up transistor PU-2 as discussed above with reference to FIG. 2.

Regarding the complementary bit line BLB 340, a via 342 electrically couples the complementary bit line BLB 340 on M3 to contact line 344 on M2, which is electrically coupled to contact line 236 on M1 through via 346. The contact line 236 on M1 is electronically coupled to the source of the second pass-gate transistor PG-2 as discussed above with reference to FIG. 2.

Regarding the second $V_{ss}$ line 350, a via 352 electrically couples the second $V_{ss}$ line 350 on M3 to contact line 354 on M2, which is electrically coupled to contact line 230 on M1 through via 356. The contact line 230 on M1 is electrically coupled to the source of the second pull-down transistor PD-2 as discussed above with reference to FIG. 2.

A WL 360 is located on M2 and is preferably oriented such that the longitudinal axis of the word line wire is parallel to the longer side of the unit cell 260. A via 362 electrically couples the word line wire 360 to the contact line 234 on M1. The contact line 234 is electrically coupled to the gate of the first pass-gate transistor PG-1, as discussed above with reference to FIG. 2. A second via 364 electrically couples the word line wire 360 to the contact line 238 on M1. The contact line 238 on M1 is electrically coupled to the gate of the second pass-gate transistor PG-2 as discussed above with reference to FIG. 2.

Referring to FIG. 2, it should be noted that intra-cell connections 220 and 224 are shown on M1, but no connections are made to the intra-cell connections 220 and 224 from any other component or structure on M2 or M3. As noted above, the intra-cell connections 220 and 224 act to electrically couple various semiconductor components.

Figure 4:
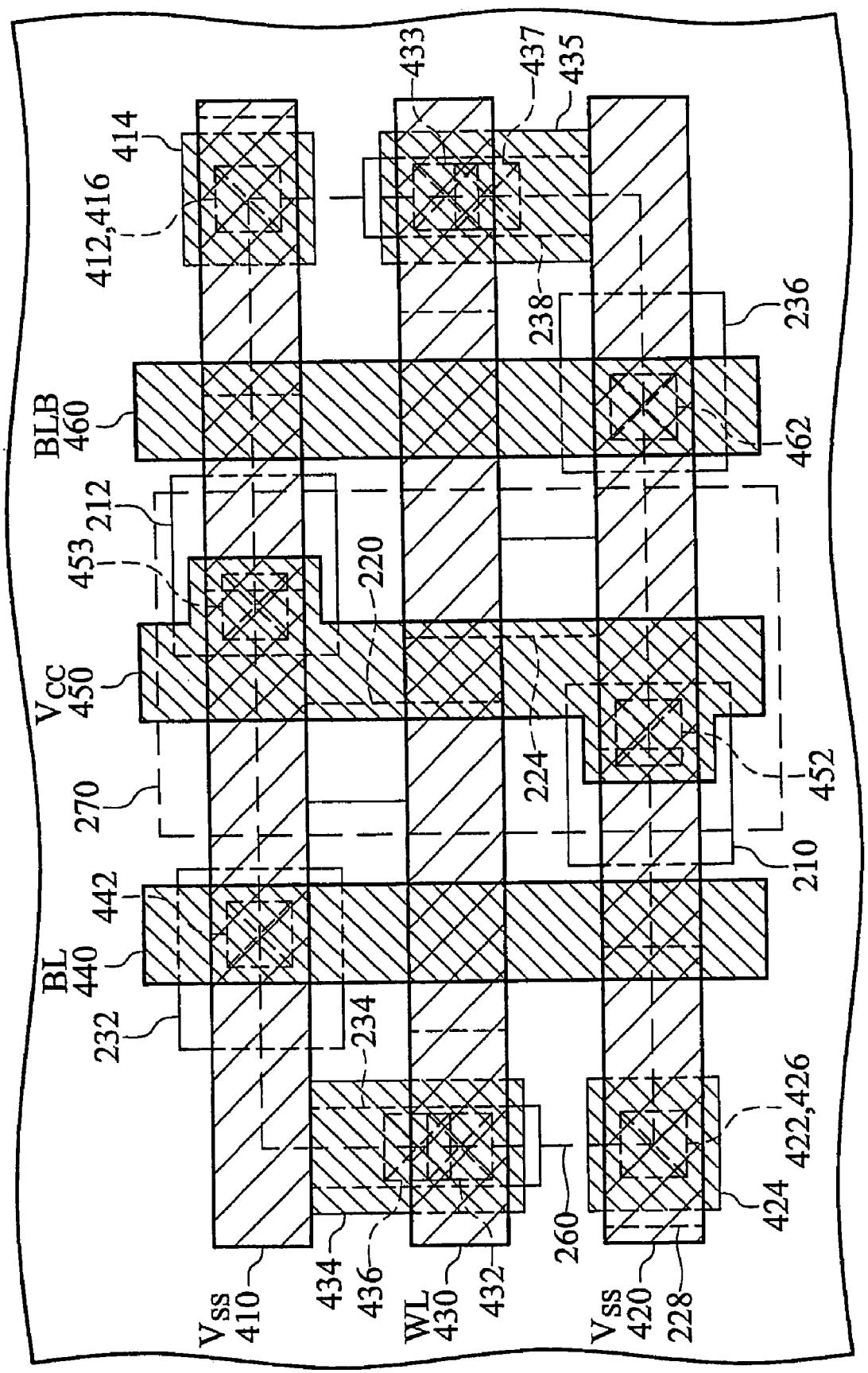
FIG. 4 is a plan view of M1, M2, and M3 layers in accordance with a second embodiment of the present invention.

In a second illustrative embodiment, the plan view of FIG. 2 and the plan view of FIG. 4 may be combined to form a high speed SRAM cell having a low SER. FIG. 2 shows selected semiconductor layers of the first embodiment and the first metal layer (M1). FIG. 4 is a plan view combining M1, M2, and M3 that may be used in conjunction with the memory cell layout illustrated in FIG. 2 in accordance with a second embodiment of the present invention. Referring to FIG. 4, the M3 layer includes a first $V_{ss}$ line 410, a second $V_{ss}$ line 420, and a WL 430. In this embodiment, the longitudinal axis of the lines contained on M3 is preferably parallel to the longer side of the unit cell 260. Regarding the first $V_{ss}$ line 410, a via 412 electrically couples the $V_{ss}$ line 410 on M3 to contact line 414 on M2, which is electrically coupled to contact line 230 on M1 as discussed above with reference to FIG. 2 through via 416. The contact line 230 on M1 is electrically coupled to the source of the second pull-down transistor PD-2 as discussed above with reference to FIG. 2. It should be noted that via 412 and via 416 substantially coincide in this plan view, and thereby appear as a single via.

Regarding the second $V_{ss}$ line 420, a via 422 electrically couples the $V_{ss}$ line 420 on M3 to contact line 424 on M2, which is electrically coupled to contact line 228 on M1 (as shown in FIG. 2) through via 426. The contact line 228 on M1 is electronically coupled to the source of the first pull-down transistor PD-1 as discussed above with reference to FIG. 2. It should be noted that via 422 and via 426 substantially coincide in this plan view, and thereby appear as a single via.

Regarding the word line wire 430, a via 432 electrically couples the word line wire 430 to the contact line 434 on M2, which is electrically coupled to contact line 234 on M1 through via 436. The contact line 234 is electrically coupled to the gate of the first pass-gate transistor PG-1 as discussed above with reference to FIG. 2. A second via 433 electrically couples the word line wire 430 to the contact line 435 on M2, which is electrically coupled to contact line 238 on M1 through via 437. The contact line 238 is electrically coupled to the gate of the second pass-gate transistor PG-2 as discussed above with reference to FIG. 2.

The M2 layer comprises BL 440, a $V_{cc}$ line 450, and a complementary bit line BLB 460. In this embodiment, it is preferred that the lines on M2 are oriented such that the longitudinal axes are parallel to the shorter side of the unit cell 260. Regarding the bit line wire BL 440, a via 442 electrically couples the bit line wire BL 440 on M2 to contact line 232 on M1, which is electrically coupled to the source of the first pass-gate transistor PG-1 as discussed above with reference to FIG. 2.

Regarding the $V_{cc}$ line 450, a via 452 electrically couples the $V_{cc}$ line 450 on M2 to contact line 210 on M1, which is electrically coupled to the source of the first pull-up transistor PU-1. Additionally, a via 453 electrically couples the $V_{cc}$ line 450 to contact line 212 on M1, which is electrically coupled to the source of the second pull-up transistor PU-2 as discussed above with reference to FIG. 2.

Regarding the complementary bit line BLB 460, a via 462 electrically couples the complementary bit line BLB 460 on M2 to contact line 236 on M1. The contact line 236 on M1 is electrically coupled to the source of the second pass-gate transistor PG-2 as discussed above with reference to FIG. 2.

Referring to FIG. 2, it should be noted that intra-cell connections 220 and 224 are shown on M1, but no connections are made to the intra-cell connections 220 and 224 from any other component or structure on M2 or M3. As noted above, the intra-cell connections 220 and 224 act to electrically couple various semiconductor components.

Figure 5A:
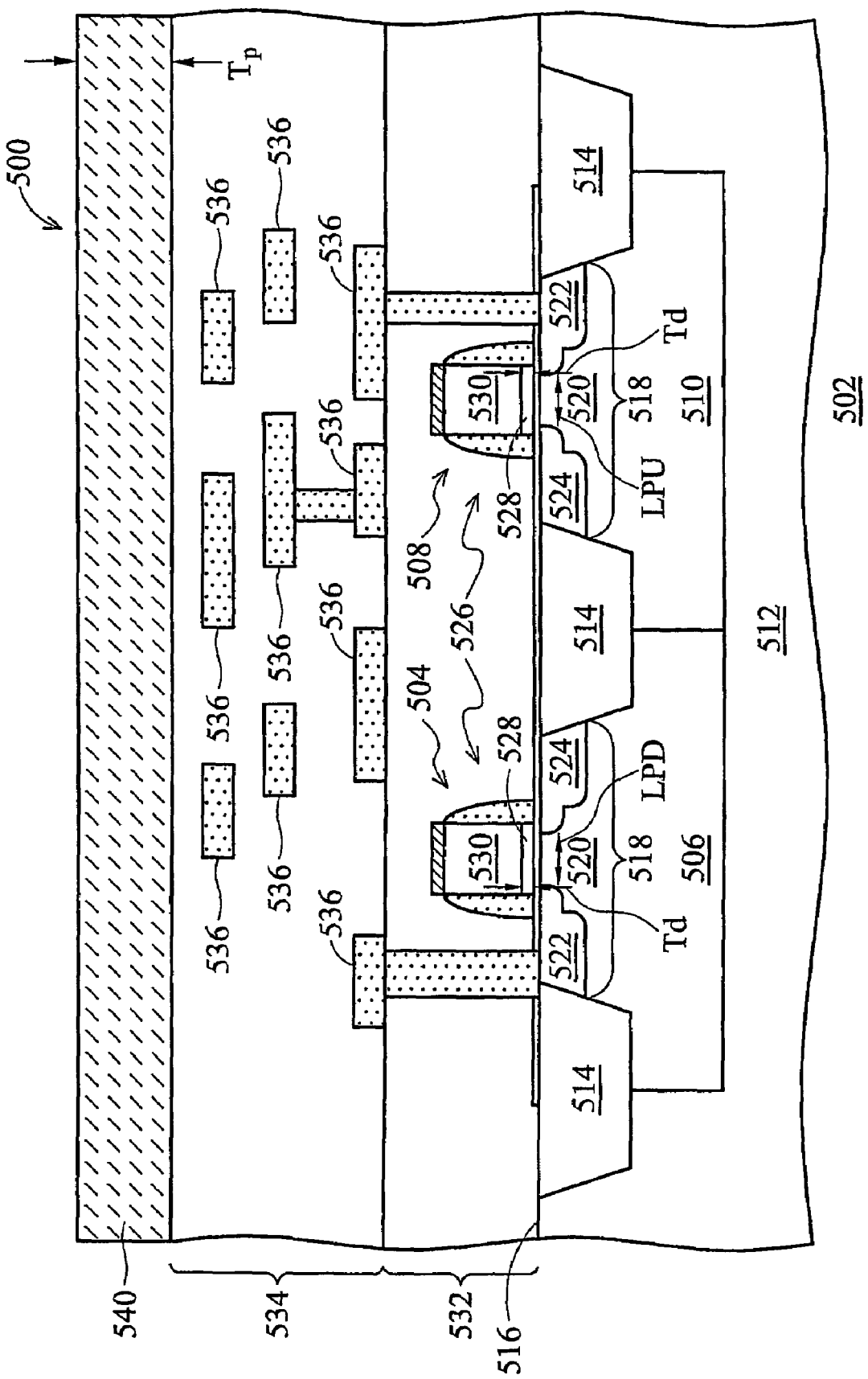
FIG. 5a is a cross sectional view of a third illustrative embodiment of the present invention.
Figure 5B:
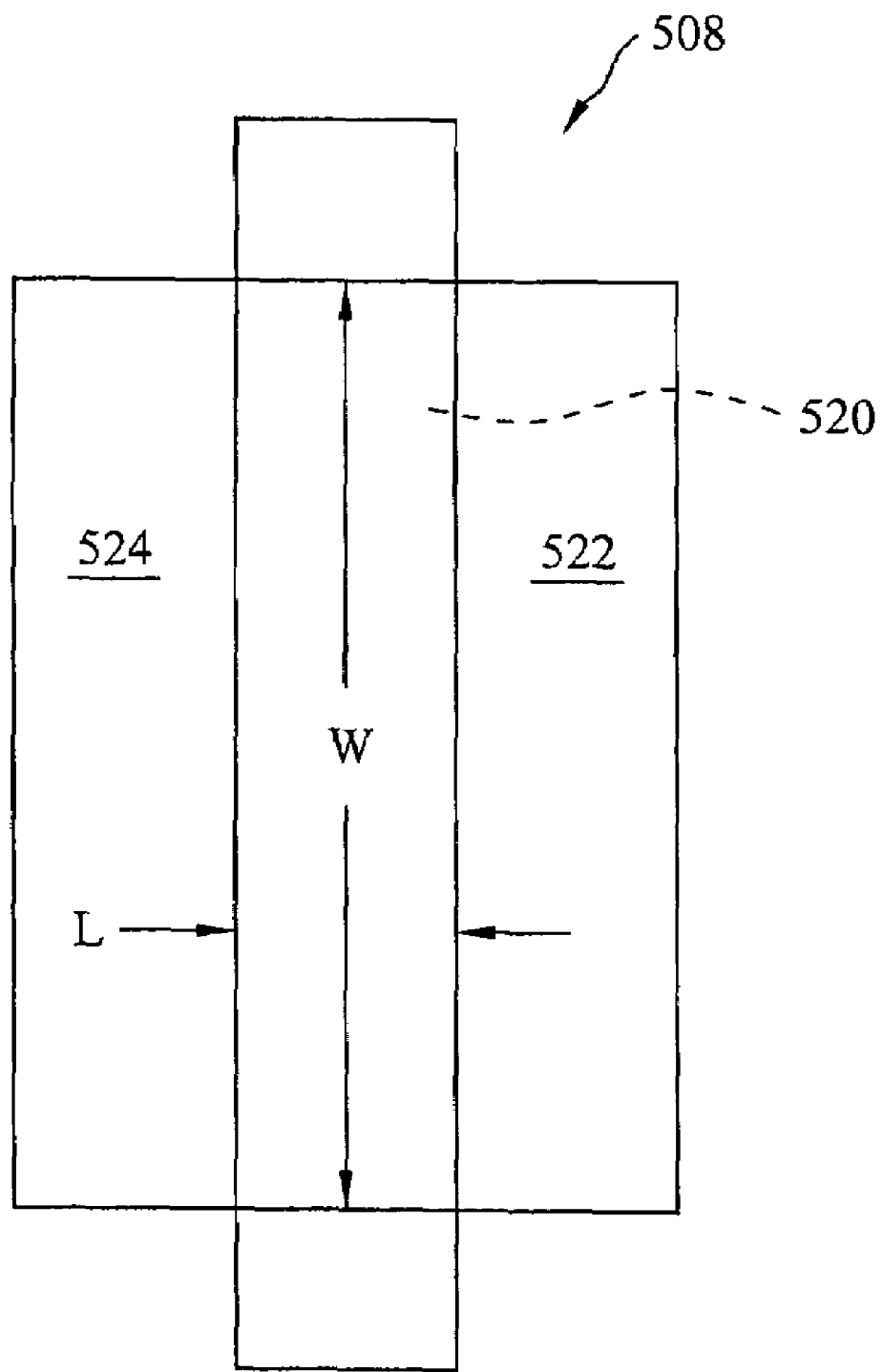
FIG. 5b is a plan view of a transistor in accordance with the third illustrative embodiment.

FIGS. 5a and 5b show a 6T-SRAM cell in accordance with a third illustrative embodiment of the present invention. FIG. 5a shows a cross sectional view of the 6T-SRAM cell 500 of the third embodiment. The discussion of the third illustrative embodiment also includes FIG. 5b, which shows a plan view of the pull down transistor 508 in the third illustrative embodiment.

FIG. 5a shows an SRAM cell 500 of the third illustrative embodiment. The substrate 502 is preferably a bulk silicon substrate. Other substrates may be used, including silicon on insulator (SOI) substrates, substrates having a substantially crystalline structure with a Miller indices of <100>, and substrates having a substantially crystalline structure with a Miller indices of <110>, for example.

An n-type metal oxide semiconductor (NMOS) transistor 504 of the third embodiment is shown in FIG. 5a in a PWELL region 506. The NMOS transistor 504 is shown beside a p-type metal oxide semiconductor (PMOS) transistor 508 in an NWELL region 510. The PWELL region 506 occupies less than about 65% of the cell area of the SRAM cell 500. The NMOS transistor 504 is a pull down transistor and the PMOS transistor 508 is a pull up transistor. The pull down 504 and pull up 508 transistors are part of a cross coupled inverter in the SRAM cell. The NWELL region 510 and the PWELL region 506 are in a deep NWELL region 512 of the substrate 502. The deep NWELL 512 surrounds the PWELL region 506 and the NWELL region 510 of the pull up 508 and pull down 504 transistors, respectively. Shallow trench isolation structures 514 isolate the transistors 508 and 504 in a region proximate the substrate surface 516. An active region 518 inside each transistor 508 and 504 comprises a channel region 520 interposed between a source region 522 and a drain region 524. The active region 518 of the NMOS transistors in the SRAM cell 500 occupy less than about 25% of the memory cell area.

FIG. 5b shows a plan view of the PMOS transistor 508 in FIG. 5a, in accordance with the third illustrative embodiment. As shown in FIG. 5b, the PMOS transistor 508, which is also referred to as a pull up transistor 508, has a channel length LPU and a channel width WPU. The NMOS transistor 504, also referred to herein as a pull down transistor 504, also has a similar channel length LPD and a channel width WPD. A ratio of the channel width WPU of the pull up transistor 508 to the channel width WPD of the pull down transistor 504 is preferably in a range between about 0.8 and about 1.5. The channel width ratio may also be greater than about 1.5, for example.

Referring to FIG. 5a, the transistors 504 and 508 of the third embodiment each have a gate structure 526. Each gate structure 526 has a gate dielectric layer 528 overlying the channel region 520 portion of the active region 518. The gate dielectric layer 528 in the pull up 508 and pull down 504 devices have a thickness Td that is less than about 20 angstroms. The gate structures 526 also have a gate electrode layer 530 comprising a plurality of conductive gate layers. The gate electrode layer 530 is overlying the gate dielectric layer 528.

A substantially boron free inter-layer-dielectric layer (ILD) 532 in FIG. 5a is overlying the pull up 508 and pull down 504 transistors. The substantially boron free ILD layer 532 may have a plurality of substantially boron free dielectric layers, for example. A plurality of inter-metal-dielectric (IMD) layers 534 overlying said substrate. At least one layer of the plurality of the IMD layer 534 has a dielectric constant less than about 3. The dielectric layers in the IMD layer 534 surround metal wires 536. The metal wires 536 and the conductive layers in the gate electrode 530 may have metal materials that include (but are not limited to) W, Al, AlCu, Cu, Cu content, silicide, Ti, TiSi2, Co, CoSi2, Ni, NiSi, TiN, TiW, TaN, and combinations thereof, for example. In other embodiment, the metal wires 536 and the conductive layers in the gate electrode 530 may include silicon.

A polyimide layer 540 overlies the entire SRAM chip in which the SRAM cell 500 resides. Alternatively, the polyimide layer 540 may cover at least a portion of the SRAM chip or a substantial portion of the SRAM chip. The polyimide layer 540 has a thickness Tp that is less than about 20 microns.

Dielectric materials in the gate dielectric layers 528 include (but are not limited to) SiON, Si3N4, Ta2O5, Al2O3, PEOX, TEOS, oxide with nitrogen content, nitrided oxide, oxide with hafnium content, oxide with tantalum content, oxide with aluminum content, a high K dielectric material having a dielectric constant greater than about 5, and combinations thereof, for example.

The SRAM cell 500 is in an SRAM chip manufactured in a 90 nm semiconductor technology generation. Alternatively, the SRAM chip may be manufactured in generations above and below the 90 nm generation, including the 65 nm generation, and the 45 nm generation, for example.

Figure 6:
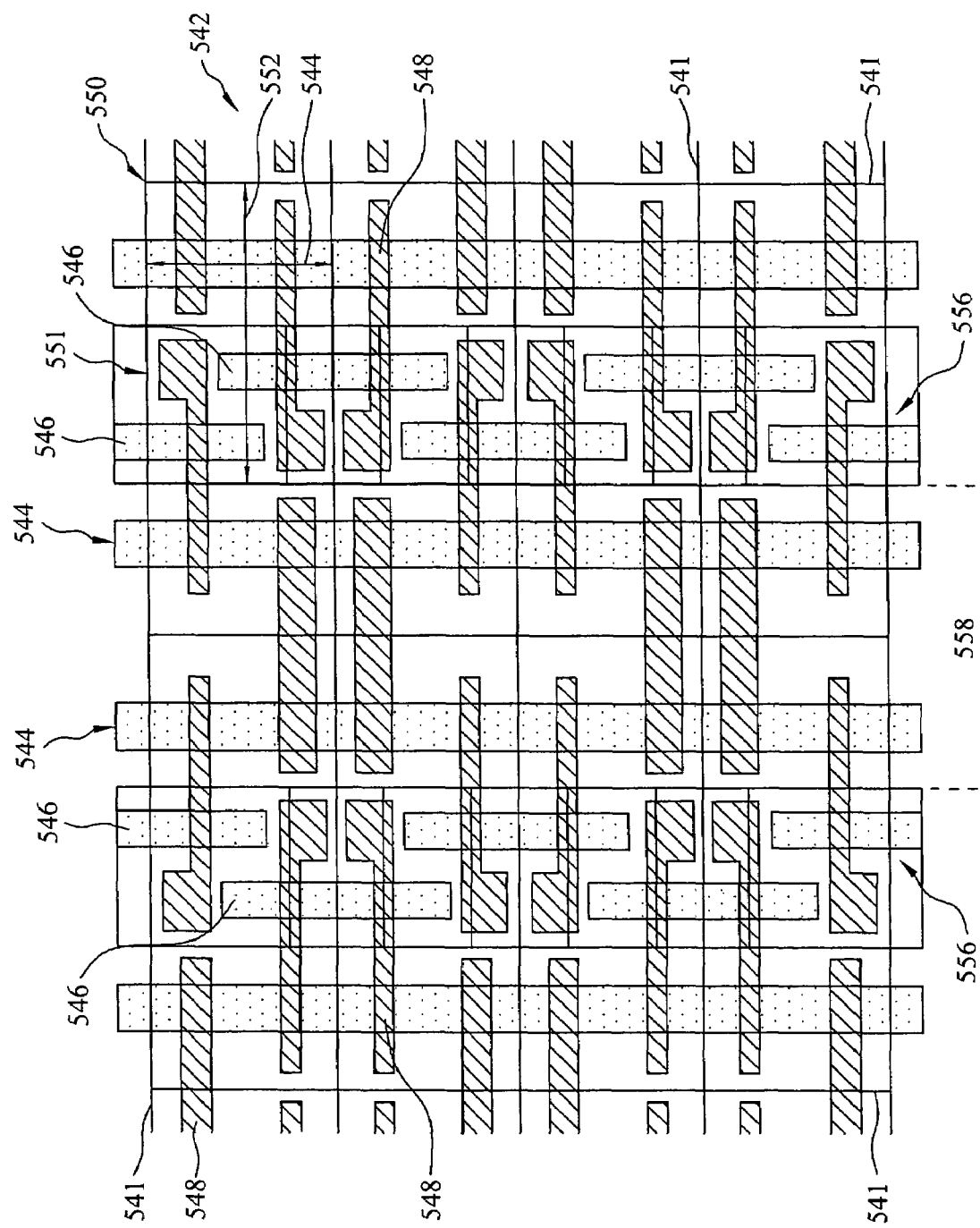
FIG. 6 is a plan view of a portion of an array of SRAM cells in accordance with an illustrative embodiment of the present invention.

FIG. 6 shows a plan view of a portion of an SRAM device in accordance with an illustrative embodiment of the present invention. More specifically, FIG. 6 shows a plan view of a portion of an SRAM array 542 in the SRAM device. The SRAM array 542 includes a plurality of substantially similar SRAM cells 550 repeated in rows and columns. Thin solid lines 541 show the unit cell boundaries of other SRAM cells 550 in the array 542. FIG. 6 shows an array eight SRAM cells 550 in four rows and two columns. The array 542 may be duplicated to create arrays having any number of row and columns. Illustrative embodiments preferably include SRAM arrays having at least 8 columns and at least 8 rows of SRAM cells. For illustrative purposes, the SRAM cell 550 in the upper right corner of FIG. 6 has a unit cell boundary shown with a dashed line. The area inside the unit cell boundary is the cell area of the SRAM cell 550. The unit cell boundary has a first pitch 552 and a second pitch 554. The first pitch 552 has a greater length than the second pitch 554. An aspect ratio of the SRAM cell 550 is a ratio of the longer pitch 552 to the smaller pitch 554. The aspect ratio of the SRAM cell 550 is about 1.8. In illustrative embodiments, SRAM cells in SRAM arrays may have aspect ratios of 2, 2.5, and 3, for example.

The SRAM 542 array in FIG. 6 includes p-diffusion regions 546 in NWELL regions 556, and n-diffusion regions 544 in PWELL regions 558. Gate electrodes 548 are shown overlying the diffusion regions 544 and 546. Within the unit cell boundary of the SRAM cell 550, the n-diffusion regions 544 occupy less than about 25% of the memory cell area. In addition, the PWELL regions 558 occupy less than about 65% of the area within the unit cell area 550.

Figure 7:
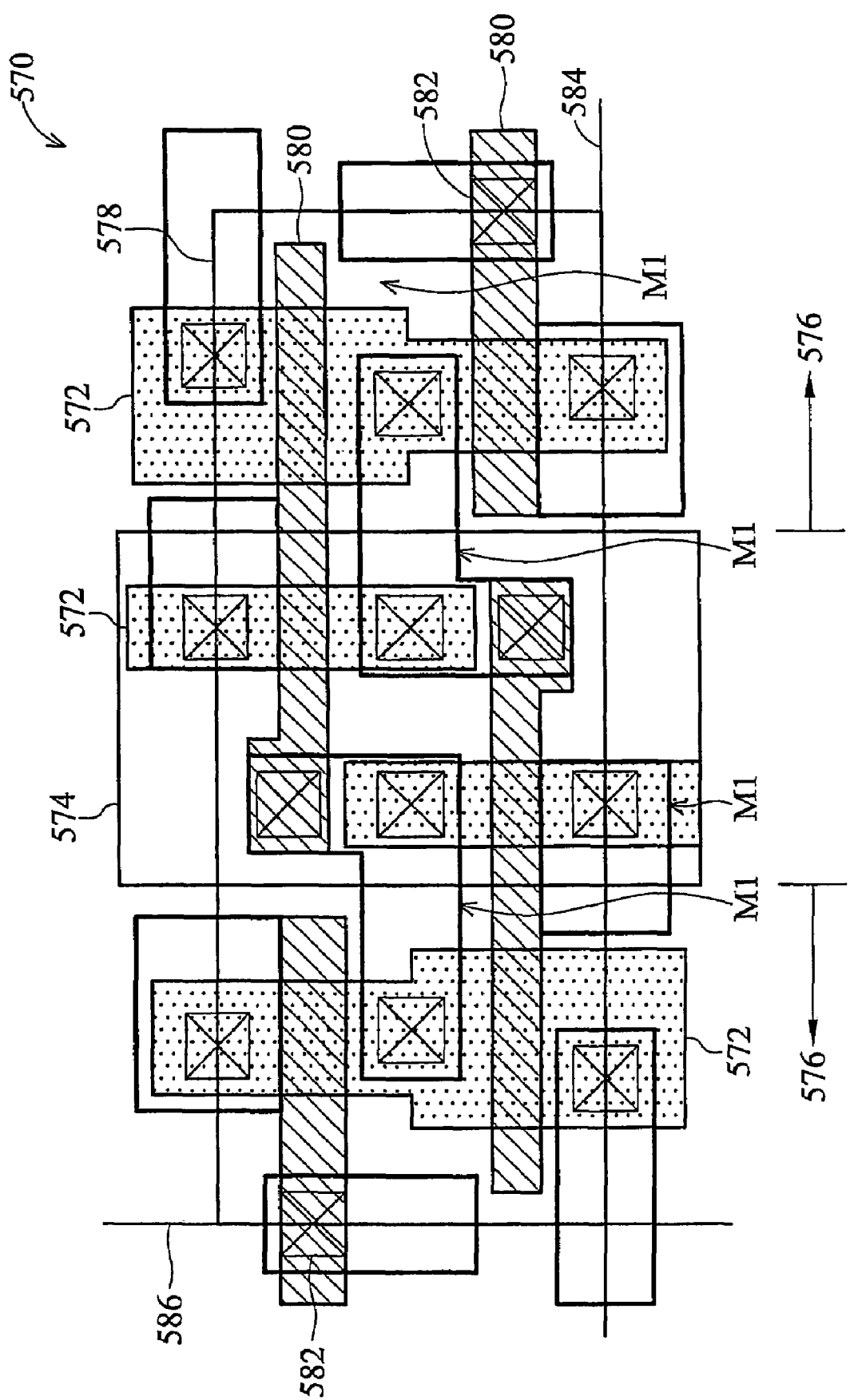
FIG. 7 is a plan view in accordance with a fourth illustrative embodiment.

FIG. 7 shows a plan view of an SRAM cell 570 in accordance with a fourth illustrative embodiment of the present invention. FIG. 7 is a plan view of the fifth illustrative embodiment, which includes a high speed 6T-SRAM cell 570. In operation, the high speed 6T-SRAM 570 operates substantially the same as 6T-SRAM cells described above. FIG. 7 shows the active areas 572, the PWELL region 576 interposed between two portions of an NWELL region 574, a unit cell boundary 578, polysilicon layers 580, the plug layer 582, and the first metal layer M1. The unit cell boundary 578 is drawn along an X axis 584 and a Y axis 586. The unit cell boundary 578 is longer along the X axis 584 than it is along the Y axis 586. A cell aspect ratio of the length of the unit cell boundary 578 along the X axis 584 to the length of the cell boundary 578 along the Y axis 586 is at least about 2.5.

Several embodiments may be illustrated by combining the plan view in FIG. 7 with the view shown in other figures described above. The plan view shown in FIG. 3, which combines M1, M2, and M3 as described above, may be used in conjunction with the memory cell layout illustrated in FIG. 7, in accordance with an illustrative embodiment of the present invention. The plan view shown in FIG. 4, as described above, may also be used in conjunction with the memory cell layout illustrated in FIG. 7, in accordance with an illustrative embodiment of the present invention.

Figure 8:
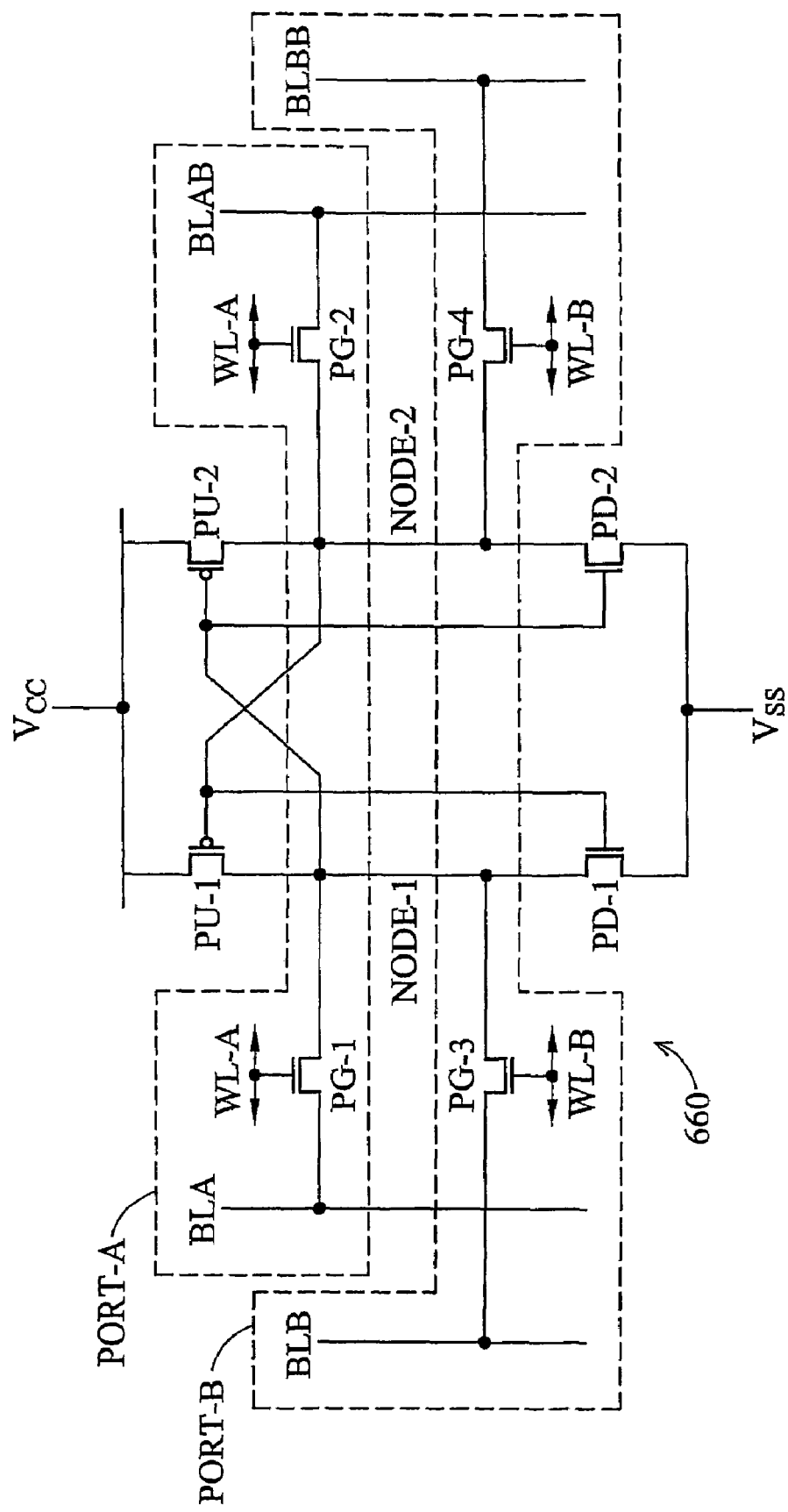
FIG. 8 is a schematic view in accordance with a fifth illustrative embodiment.
Figure 9:
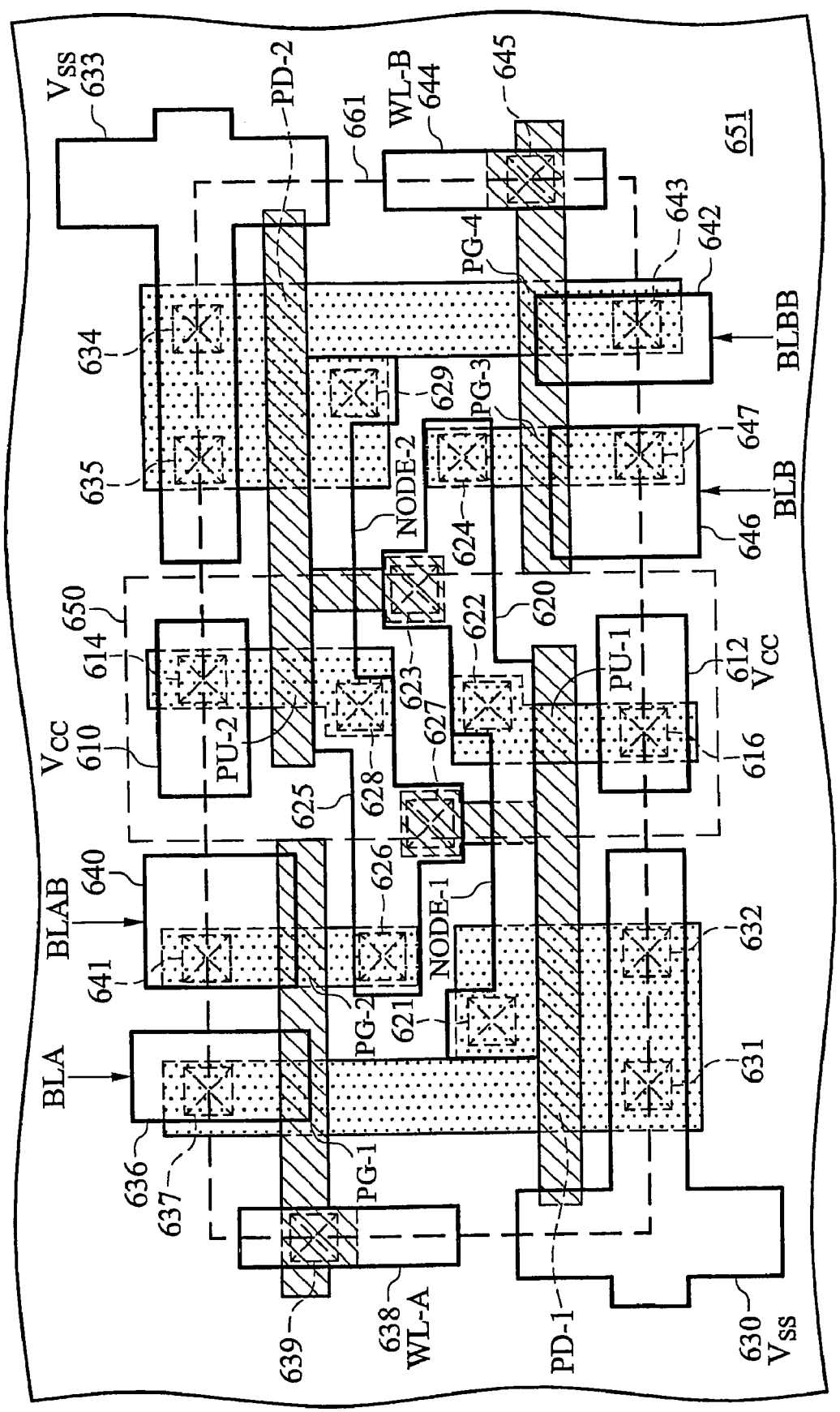
FIG. 9 is a plan view in accordance with the fifth illustrative embodiment.

FIGS. 8 and 9 show a 6T-SRAM cell in accordance with a fifth illustrative embodiment of the present invention. FIG. 8 is a schematic view of a dual port 8T-SRAM cell 660 of the fifth embodiment. FIG. 9 is a cell layout of the dual port 8T-SRAM cell 660 of the fifth illustrative embodiment.

In accordance with a fifth illustrative embodiment, a dual port eight transistor (8T) SRAM cell 660 is shown in FIG. 8. In operation, the 8T-SRAM 660 operates substantially the same as a 6T-SRAM. In contrast with a 6T-SRAM however, the dual port 8T SRAM cell 660 of the fifth embodiment includes two ports, PORT-A and PORT-B. PORT-A includes the NMOS pass gate transistor PG-1, the NMOS pass gate transistor PG-2, the bit line BLA, the complementary bit line BLB, and the word line WL-A. PORT-B includes the NMOS pass gate transistor PG-3, the NMOS pass gate transistor PG-4, the bit line BLB, the complementary bit line BLBB, and the word line WL-B. The two bit lines, i.e., bit line A (BLA) and bit line B (BLB), and the two complementary bit lines, i.e., complementary bit line A (BLAB) and complementary bit line B (BLBB), provide data lines to read data from and write data to the 8T-SRAM 660. The two word lines, i.e., word line A (WL-A) and word line B (WL-B), control the pass gate transistors to control the reading and writing.

As shown in FIG. 8, the bit line wire BLA is electrically connected to the source of the pass gate device PG-1 and the bit line wire BLAB is electrically connected to the source of the pass gate device PG-2. In port B, the bit line wire BLB is electrically connected to the source of the pass gate device PG-3 and the source of the bit line wire BLBB is electrically connected to the source of the pass gate device PG-4. The data bit lines BLA, BLAB, BLB, and BLBB are for data input and output, and are herein collectively referred to as the 8T dual port bit line wires.

FIG. 9 illustrates a cell layout of the dual port 8T-SRAM cell 660 in accordance with the fifth illustrative embodiment of the present invention. The dual port 8T-SRAM cell 660 comprises a first pass-gate transistor PG-1, a second pass-gate transistor PG-2, a third pass-gate transistor PG-3, a fourth pass-gate transistor PG-4, a first pull-up transistor PU-1, a second pull-up transistor PU-2, a first pull-down transistor PD-1, and a second pull-down transistor PD-2 formed on a substrate. The substrate may be, for example, formed of bulk Si, SiGe, strained-Si, SOI, non-bulk Si, or the like. The gate electrode layer has a thickness that is less than about 2000 Å. The gate thicknesses of the transistors are preferably less than about 1000 Å and may be varying widths. The gate dielectric layer of the transistors may be a single layer or multiple layers, wherein at least one layer preferably comprises $SiO_2$, nitrided oxide, a nitrogen-containing oxide, SiON, a metal oxide, a high-K dielectric, or a combination thereof.

Preferably, the first pull-up transistor PU-1 and the second pull-up transistor PU-2 shown in FIG. 9 are PMOS transistors formed in an n-well 650, or a deep n-well, and the other transistors are NMOS transistors. The sources of the first pull-up transistor PU-1 and the second pull-up transistor PU-2 are electrically coupled to a voltage source $V_{cc}$ contact lines 610 and 612, respectively, located on M1, via plugs 614 and 616.

In FIG. 9, the drain of the first pull-up transistor PU-1, the drain of the first pull-down transistor PD-1, the drain of the first pass-gate transistor PG-1, the drain of the third pass-gate transistor PG-3, and the gates of the second pull-up transistor PU-2 and second pull-down transistor PD-2 are electrically coupled via an intra-cell connection 620, also referred to as NODE-1, located on M1 and plugs 621, 622, 623, and 624. Similarly, the drain of the second pull-up transistor PU-2, the drain of the second pull-down transistor PD-2, the drain of the second pass-gate transistor PG-2, the drain of the fourth pass-gate transistor PG-4, and the gates of the first pull-up transistor PU-1 and first pull-down transistor PD-1 are electrically coupled via an intra-cell connection 625 located on M1 and plugs 626, 627, 628, and 629.

The source of the first pull-down transistor PD-1 is electrically coupled to ground $V_{ss}$ via $V_{ss}$ contact line 630 and plugs 631 and 632; and the source of the second pull-down transistor PD-2 is electrically coupled to ground $V_{ss}$ via $V_{ss}$ contact line 633 and plugs 634 and 635. The source of the first pass-gate transistor PG-i is electrically coupled to a bit line wire BLA via a BLA contact line 636 and plug 637. The first pass-gate transistor PG-1 electrically couples the bit line wire BLA to the drain of the first pull-up transistor PU-1 and the drain of the first pull-down transistor PD-1. The gates of the first pass-gate transistor PG-1 and the second pass-gate transistor PG-2 are electrically coupled to a word line WL-A via a WL-A contact line 638 on M1 and plug 639. The source of the second pass-gate transistor PG-2 is electrically coupled to the complementary bit line wire BLAB via a BLAB contact line 640 and plug 641.

As shown in FIG. 9, the source of the fourth pass-gate transistor PG-4 of the fifth embodiment is electrically coupled to the complementary bit line wire BLBB via a BLBB contact line 642 and plug 643. The fourth pass-gate transistor PG-4 electrically couples the bit line wire BLBB to the drain of the second pull-up transistor PU-2 and the drain of the second pull-down transistor PD-2. The gates of the fourth pass-gate transistor PG-4 and the third pass-gate transistor PG-3 are electrically coupled to a word line WL-B via a WL-B contact line 644 on M1 and plug 645. The source of the third pass-gate transistor PG-3 is electrically coupled to a bit-line wire BLB via a BLB contact line 646 and plug 647. As discussed above, the drain of the third pass-gate transistor PG-3 is electrically coupled to the gates of the second pull-up transistor PU-2 and the second pull-down transistor PD-2, the drain of the first pull-up transistor PU-1, the drain of the first pull-down transistor PD-1 and the drain of the first pass-gate transistor PG-1.

A gate width ratio of the gate width of the pull up transistor PU-2 to the gate width of the pull down transistor PD-2 is in a range between about 0.8 and about 1.5. A gate width ratio of the gate width of the pull up transistor PU-1 to the gate width of the pull down transistor PD-1 is also in a range between about 0.8 and about 1.5.

The 8T SRAM cell 660 shown in FIG. 9 is under a substantially boron free inter-layer-dielectric (ILD) layer. The substantially boron free ILD layer preferably includes one or more substantially boron free dielectric layers having one or more substantially boron free dielectric materials. A bottom layer in the substantially boron free ILD layer preferably includes a PSG material.

In the fifth embodiment, an IMD layer overlies the ILD layer. A plurality of inter-metal-dielectric (IMD) layers 534 overlying said substrate. At least one layer of plurality of The IMD layer comprises a plurality of dielectric materials. At least one of the plurality of dielectric materials has a dielectric constant lower than about 3. The IMD layer also includes the 8T dual port bit line wires, Vss wires and Vcc wires. The 8T dual port bit line wires, the Vss wires and the Vcc wires are preferably on the same metal layer (e.g., M1, M2), and overly the 8T dual port SRAM unit cell boundary. The 8T dual port bit line wires are shielded by the Vss wires and/or the Vcc wires. More specifically, a first Vss wire interposed between the bit line wire BLA and the bit line bar wire BLAB shields the bit line wire BLA from the bit line bar wire BLAB. A second Vss wire interposed between the bit line wire BLB and the bit line bar wire BLBB shields the bit line wire BLB from the bit line bar wire BLBB. A Vcc wire interposed between the BLB wire and the BLA wire provides electrical shielding to the BLB and the BLA wires. A polyimide layer overlies the entire SRAM chip in which the 8T SRAM cell 660 resides. Alternatively, the polyimide layer may cover at least a portion of the SRAM chip or a substantial portion of the SRAM chip. The polyimide layer has a thickness that is less than about 20 microns.

A unit cell boundary 661 encloses the 8T dual port SRAM cell 660 of the fifth embodiment shown in FIG. 9. The unit cell 660 has a cell area enclosed by the unit cell boundary 661. The unit cell boundary defines the basic building block for designing memory cell arrays having the dual port SRAM cell 660. The dual port SRAM cell 660 may be duplicated (e.g., thousands, millions, and billions) of times to create larger memories. The unit cell boundary 661 in FIG. 9 has a rectangular shape with two longer sides and two shorter sides. Preferably, the length of a longer side of the unit cell boundary 661 is about 3 times or greater than the length of a shorter side of the unit cell boundary 661. In the fifth embodiment, the transistors are aligned such that the longitudinal axis of the NWELL 650, and the 8T dual port bit line wires are parallel to the shorter side of the unit cell boundary 661.

An n-well 650 in FIG. 9 may also be a deep n-well, and is formed within the unit cell boundary 661. Preferably, the substrate 651 is a p-type substrate, thereby providing a large p-well substantially encircling the n-well 650, in which NMOS devices may be formed. The n-well 650 is formed in the substrate 650 by performing an implant with n-type ions as is known in the art, thereby allowing PMOS devices to be formed therein, such as the first pull-up transistor PU-1 and the second pull-up transistor PU-2.

Preferably, the NMOS active areas (e.g., the source/drain areas of the first pass-gate transistor PG-1, the first pull-down transistor PD-1, the second pass-gate transistor PG-2, and the second pull-down transistor PD-2) comprise less than about 25% of the area inside the unit cell boundary 660, and the p-well area (e.g., the p-type substrate 651 surrounding the n-well 650) inside the unit cell boundary 660 comprises less than about 65% of the total area inside the unit cell boundary 660.

Figure 10:
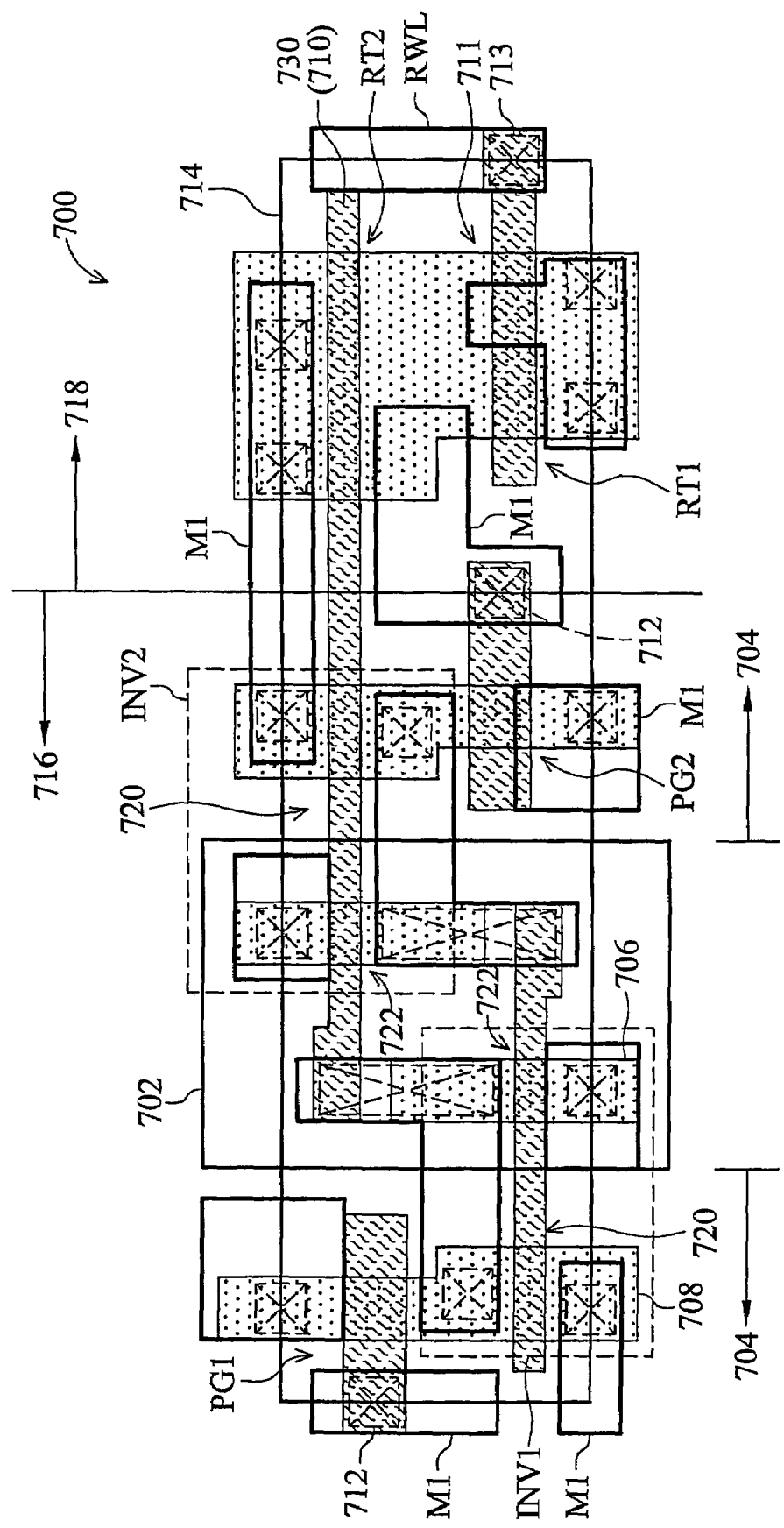
FIG. 10 is a first plan view in accordance with a sixth illustrative embodiment.
Figure 11:
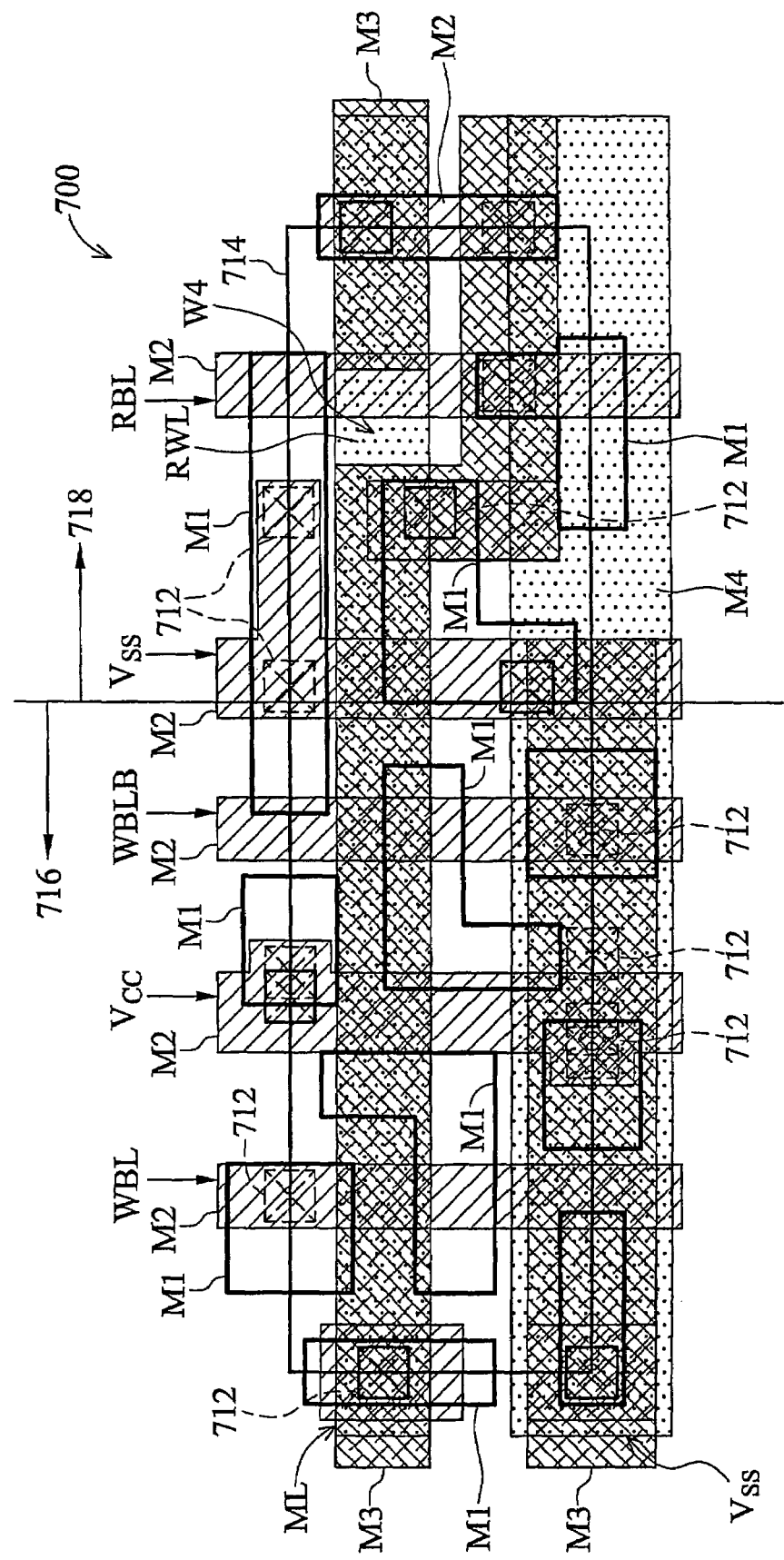
FIG. 11 is a second plan view in accordance with the sixth illustrative embodiment.

FIGS. 10 and 11 show a 6T-SRAM cell in accordance with a sixth illustrative embodiment of the present invention. FIG. 10 is a plan view of a two port 8T-SRAM cell 700 of the sixth embodiment. FIG. 11 is a plan view of metal layers M1, M2, and M3 in the dual port 8T-SRAM cell 700 of the fifth illustrative embodiment.

Referring to FIG. 10, a plan view of the sixth illustrative embodiment, which includes an 8T two-port SRAM cell 700, is shown. FIG. 10 shows a plan view of an NWELL region 702, a PWELL region 704, p-type active areas 706, n-type active areas 708, gate electrodes 710, contacts 712, and metal 1 (M1) wires. The unit cell boundary 714 is also shown. A cell aspect ratio of the unit cell boundary 714 for the 8T two-port SRAM cell 700 is larger than about 3. Specifically, a longer side of the unit cell boundary 714 measures a greater distance than a shorter side of the unit cell boundary 714 by a factor of about 3.

The sixth illustrative embodiment shown in FIG. 10 is divided into to a write portion 716 and a read portion 718 for illustrative purposes. Devices in the write portion 716 are largely responsible for writing to the 8T two-port SRAM cell 700 while the devices in the read portion 718 are largely responsible for reading from the 8T two-port SRAM cell 700.

The 8T two-port SRAM cell 700 of the sixth embodiment includes two NMOS pass gate transistors PG-1 and PG-2 in the write portion 716, and two NMOS read transistors RT1 and RT2 in the read portion 718. The transistors RT1 and RT2 are electrically connected in series. The write portion 716 also includes two NMOS 720 and two PMOS transistors 722, which are interconnected to form two cross coupled inverters INV1 and INV2. The inverters each include a pull up PMOS transistor and a pull down NMOS transistor interconnected as is known in the art. The gate electrode 730 of the read transistor RT2 is also the gate electrode of the inverter INV2. The gate electrode 711 of the read transistor RT2 is electrically connected to the read port word line wire RWL by the contact 713.

FIG. 11 is a plan view showing metal wires in the 8T two-port SRAM cell 700 of the sixth illustrative embodiment. FIG. 11 shows the metal 1 layer M1, the metal layer 2 (M2), and the metal layer 3 (M3), and via layers 712. The read port 718 includes a read port bit line wire RBL and a read port word line wire RWL. Both wires are in a metal 2 layer (M2). Two of the bit lines in the M2 layer are a write port bit line wire WBL and a write port bit line bar wire WBLB. A ground supply conductor line Vss, and a power supply conductor line Vcc, are used to shield the bit line wires RBL, WBL and WBLB. The write port bit line wire WBL is shielded from the write port bit line bar WBLB wire by the power supply conductor line Vcc. The read port bit line wire RBL is shielded from the bit line bar wire WBLB in the write port by the ground supply conductor line Vss.

Although particular embodiments of the invention have been described in detail with reference to specific embodiments, it is understood that the invention is not limited correspondingly in scope, but includes all changes, modifications, and equivalents coming within the spirit and terms of the claims appended hereto. For example, different arrangements of the metal layers may be used. Accordingly, it is understood that this invention may be extended to other structures and materials, and thus, the specification and figures are to be regarded in an illustrative rather than a restrictive sense.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a substrate;
an SRAM device in said substrate;
an SRAM cell in said SRAM device, wherein said SRAM cell comprises
a cell area comprising
a first cell pitch aligned along a longer side of said cell area, and
a second cell pitch aligned along a shorter side of said cell area, wherein a cell pitch ratio of said first cell pitch to said second cell pitch is larger than about 2; and
a plurality of inter-metal-dielectric (IMD) layers overlying said substrate, said at least one layer of said plurality of IMD layers having a dielectric constant less than about 3 and comprising metal wires therein.

2. The semiconductor device of claim 1, further comprising a deep NWELL region, wherein said deep NWELL region surrounds said SRAM device.

3. The semiconductor device of claim 1, further comprising a substantially boron free inter-layer-dielectric (ILD) layer interposed between said substrate and said IMD layer.

4. The semiconductor device of claim 1, further comprising a deep NWELL region, wherein said deep NWELL region surrounds said SRAM device, further comprising a substantially boron free inter-layer-dielectric (ILD) layer interposed between said substrate and said IMD layer.

5. The semiconductor device of claim 4, wherein said ILD layer comprises phosphosilicate glass (PSG).

6. The semiconductor device of claim 1, further comprising a polyimide layer overlying said SRAM device, wherein said polyimide layer has a thickness that is less than about 20 microns.

7. The semiconductor device of claim 1, wherein said SRAM cell further comprises
a cell area comprising an NWELL region and a PWELL region, wherein said PWELL region occupies less than about 65% of said cell area,
a plurality of n-type metal oxide semiconductor (NMOS) transistors in said PWELL region,
a plurality of p-type metal oxide semiconductor (PMOS) transistors in said NWELL region, and
wherein a total area of said active regions of said NMOS transistors is less than about 25% of said cell area.

8. The semiconductor device of claim 1, wherein said SRAM cell further comprises
a first and a second inverter, wherein an output of said first inverter is electrically coupled to an input of said second inverter, wherein an output of said second inverter is electrically coupled to an input of said first inverter, and wherein each of said inverters comprise an input and an output,
a pull down transistor comprising one of said plurality of said NMOS transistors, and
a pull up transistor comprising one of said plurality of said PMOS transistors, wherein a ratio of said channel width of said pull up transistor to said channel width of said pull down transistor is greater than about 0.8.

9. A semiconductor device comprising:
a substrate;
an SRAM device in said substrate;
an SRAM cell in said SRAM device, wherein said SRAM cell comprises
a cell area comprising an NWELL region and a PWELL region, wherein said PWELL region occupies less than about 65% of said cell area,
a plurality of n-type metal oxide semiconductor (NMOS) transistors in said PWELL region,
a plurality of p-type metal oxide semiconductor (PMOS) transistors in said NWELL region, and
wherein a total area of said active regions of said NMOS transistors is less than about 25% of said cell area; and
a plurality of inter-metal-dielectric (IMD) layers overlying said substrate, at least one layer of said plurality of IMD layers having a dielectric constant less than about 3 and comprising metal wires therein.

10. The semiconductor device of claim 9, further comprising a deep NWELL region, wherein said deep NWELL region surrounds said SRAM device, further comprising a substantially boron free inter-layer-dielectric (ILD) layer interposed between said substrate and said IMD layer.

11. The semiconductor device of claim 10, wherein said ILD layer comprises phosphosilicate glass (PSG).

12. The semiconductor device of claim 9, further comprising a polyimide layer overlying said IMD layers, wherein said polyimide layer has a thickness that is less than about 20 microns.

13. The semiconductor device of claim 9, wherein said SRAM cell further comprises
a first and a second inverter, wherein an output of said first inverter is electrically coupled to an input of said second inverter, wherein an output of said second inverter is electrically coupled to an input of said first inverter, and wherein each of said inverters comprise an input and an output,
a pull down transistor comprising one of said plurality of said NMOS transistors, and
a pull up transistor comprising one of said plurality of said PMOS transistors, wherein a ratio of said channel width of said pull up transistor to said channel width of said pull down transistor is greater than about 0.8.

14. A semiconductor device comprising:
a substrate;
an SRAM device in said substrate;
an eight transistor (8T) dual port SRAM cell in said SRAM device, wherein said SRAM cell comprises
a cell area comprising
a first cell pitch aligned along a longer axis of said cell area, and
a second cell pitch aligned along a shorter axis of said cell area, wherein a cell pitch ratio of said first cell pitch to said second cell pitch is greater than about 3, and
a plurality of inter-metal-dielectric (IMD) layers overlying said substrate, at least one layer of said plurality of IMD layers having a dielectric constant less than about 3 and comprising metal wires therein.

15. The semiconductor device of claim 14, further comprising a deep NWELL region, wherein said deep NWELL region surrounds said SRAM device, further comprising a substantially boron free inter-layer-dielectric (ILD) layer interposed between said substrate and said IMD layer.

16. The semiconductor device of claim 14, further comprising a polyimide layer overlying said SRAM device, wherein said polyimide layer has a thickness that is less than about 20 microns.

17. The semiconductor device of claim 14, wherein said SRAM cell further comprises
   a cell area comprising an NWELL region and a PWELL region, wherein said PWELL region occupies less than about 65% of said cell area,
   a plurality of n-type metal oxide semiconductor (NMOS) transistors in said PWELL region,
   a plurality of p-type metal oxide semiconductor (PMOS) transistors in said NWELL region, and
   wherein a total area of said active regions of said NMOS transistors is less than about 25% of said cell area.

18. The semiconductor device of claim 14, wherein said SRAM cell further comprises
   a first and a second inverter, wherein an output of said first inverter is electrically coupled to an input of said second inverter, wherein an output of said second inverter is electrically coupled to an input of said first inverter, and wherein each of said inverters comprise an input and an output,
      a pull down transistor comprising one of said plurality of said NMOS transistors, and
      a pull up transistor comprising one of said plurality of said PMOS transistors, wherein a ratio of said channel width of said pull up transistor to said channel width of said pull down transistor is greater than about 0.8.

19. The semiconductor device of claim 14, wherein said SRAM cell further comprises
   a first, a second, a third, and a fourth pass gate device;
   a first port and a second port, wherein each port comprises a bit line wire and a bit line bar wire, wherein said bit line wire of said first port is electrically connected to said first pass gate device, wherein said bit line bar wire of said first port is electrically connected to said second pass gate device, wherein said bit line wire of said second port is electrically connected to said first pass gate device, and wherein said bit line bar wire of said second port is electrically connected to said second pass gate device; and
   a Vss conductor line and a Vcc conductor line, wherein said Vss conductor line shields each of said bit line wires from said bit line bar wires in each port, and said bit line wire in said first port and said bit line wire in said second port are shielded by said Vcc conductor line.

20. The semiconductor device of claim 14, wherein said SRAM cell further comprises
   a first, a second, a third, and a fourth pass gate device;
   a read port comprising
      a read port bit line wire,
      a first read transistor,
      a second read transistor, wherein said first read transistor and said second read transistor form series transistors, and
      a read port word line wire, wherein said gate electrode of said first read transistor is electrically connected to said read port word line wire;
   a write port comprising
      a first inverter, wherein a gate electrode of said second read transistor is electrically connected to an input gate electrode of said first inverter,
      a write port bit line wire, and
      a write port bit line bar wire; and
   a Vss conductor line and a Vcc conductor line, wherein said write port bit line wire is shielded from said write port bit line bar wire by said Vcc conductor line, and said bit line wire in said read port word line wire is shielded from said write port bit line wire by said Vss conductor line.

* * * * *